US012628370B2

(12) United States Patent
Takayama

(10) Patent No.: US 12,628,370 B2
(45) Date of Patent: May 12, 2026

(54) SEMICONDUCTOR DEVICE WITH MULTILAYER SOURCE AND DRAIN REGIONS FORMED IN OPENINGS OF ELECTRON SUPPLY AND TRANSIT LAYERS

(71) Applicant: SUMITOMO ELECTRIC INDUSTRIES, LTD., Osaka (JP)

(72) Inventor: Daiki Takayama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 631 days.

(21) Appl. No.: 17/804,676

(22) Filed: May 31, 2022

(65) Prior Publication Data

US 2022/0393025 A1 Dec. 8, 2022

(30) Foreign Application Priority Data

Jun. 7, 2021 (JP) ................................. 2021-095288

(51) Int. Cl.
*H10D 30/47* (2025.01)
*H10D 30/01* (2025.01)
*H10D 62/13* (2025.01)

(52) U.S. Cl.
CPC ......... *H10D 30/475* (2025.01); *H10D 30/015* (2025.01); *H10D 62/151* (2025.01)

(58) Field of Classification Search
CPC ............. H01L 29/7786; H01L 29/0847; H01L 29/66462; H01L 29/0843; H01L 29/2003; H01L 29/7787; H01L 29/0684; H01L 29/778; H10D 30/475; H10D 30/015; H10D 62/151; H10D 84/87; H10D 84/619; H10D 30/4755; H10D 62/8503; H10D 62/149; H10D 62/124; B65D 83/182; H05K 5/15; H10H 20/818; A01N 1/124
USPC .......................................................... 257/194
See application file for complete search history.

(56) References Cited

U.S. PATENT DOCUMENTS

| | | | |
|---|---|---|---|
| 7,528,040 B2 * | 5/2009 | Das ........................ | H10D 30/66 |
| | | | 438/692 |
| 9,515,161 B1 | 12/2016 | Shinohara et al. | |
| 2008/0176366 A1 | 7/2008 | Mita et al. | |
| 2010/0181575 A1 * | 7/2010 | Makita ............... | H10D 30/0321 |
| | | | 257/E21.414 |
| 2012/0021572 A1 * | 1/2012 | Mizuno .............. | H10D 30/4755 |
| | | | 438/186 |
| 2015/0041860 A1 * | 2/2015 | Nishimori ........... | H01L 21/2654 |
| | | | 257/194 |
| 2016/0268429 A1 * | 9/2016 | Huang ................ | H01L 29/0653 |

(Continued)

*Primary Examiner* — Duy T Nguyen
(74) *Attorney, Agent, or Firm* — IPUSA, PLLC

(57) ABSTRACT

A semiconductor device according to one aspect of the present disclosure includes a substrate including a first main surface, a semiconductor layer provided on the first main surface of the substrate, and a gate electrode, a source electrode, and a drain electrode, provided on the semiconductor layer. The semiconductor layer has an electron transit layer provided above the substrate and including a first upper surface, and an electron supply layer provided above the electron transit layer. The electron supply layer and the electron transit layer have a first opening and a second opening. A bottom surface of the first opening and a bottom surface of the second opening each exist at a deeper position toward the substrate than the first upper surface.

9 Claims, 9 Drawing Sheets

(56)                    References Cited

U.S. PATENT DOCUMENTS

2017/0345719 A1 *  11/2017  Chandra ......... H01L 21/823864
2018/0366549 A1 *  12/2018  Kojima ............... H10D 12/031

\* cited by examiner

SEMICONDUCTOR DEVICE WITH MULTILAYER SOURCE AND DRAIN REGIONS FORMED IN OPENINGS OF ELECTRON SUPPLY AND TRANSIT LAYERS

CROSS REFERENCE TO RELATED APPLICATIONS

This application claims priority to Japanese Patent Application No. 2021-095288 filed on Jun. 7, 2021, and the entire contents of the Japanese patent application are incorporated herein by reference.

TECHNICAL FIELD

The present disclosure relates to a semiconductor device and a method of manufacturing the semiconductor device.

BACKGROUND ART

For high electron mobility transistors (HEMT), methods have been proposed to reduce the contact resistance, which represents the total resistance components between the source and drain electrodes and the two dimensional electron-gas (2DEG). In this method, openings are formed in an electron supply layer and an electron transit layer, a GaN ($n^+$GaN) layer containing an n-type impurity at a high concentration is regrown in the openings by a metal organic chemical vapor deposition (MOCVD) method, and a source electrode and a drain electrode are formed on the $n^+$GaN layer.

[Patent Document 1] U.S. Pat. No. 9,515,161
[Patent Document 2] U.S. Patent Application Publication No. US2008/0176366

SUMMARY OF THE INVENTION

A semiconductor device according to the present disclosure includes a substrate including a first main surface, a semiconductor layer provided on the first main surface of the substrate, and a gate electrode, a source electrode, and a drain electrode, provided on the semiconductor layer. The semiconductor layer has an electron transit layer provided above the substrate and including a first upper surface, and an electron supply layer provided above the electron transit layer. The electron supply layer and the electron transit layer have a first opening and a second opening. A bottom surface of the first opening and a bottom surface of the second opening each exist at a deeper position toward the substrate than the first upper surface. The semiconductor layer further has a first source region containing a first electrically conductive impurity, provided on the bottom surface of the first opening, and including a second upper surface, a second source region containing the first electrically conductive impurity and provided on the second upper surface of the first source region, a first drain region containing the first electrically conductive impurity, provided on the bottom surface of the second opening, and including a third upper surface, and a second drain region containing the first electrically conductive impurity and provided on the third upper surface of the first drain region. The source electrode is provided on the second source region. The drain electrode is provided on the second drain region. A concentration of the first electrically conductive impurity in the second source region is lower than a concentration of the first electrically conductive impurity in the first source region. A concentration of the first electrically conductive impurity in the second drain region is lower than a concentration of the first electrically conductive impurity in the first drain region.

BRIEF DESCRIPTION OF THE DRAWINGS

FIG. 2 is a view illustrating an example of a concentration profile of n-type impurities during regrowth.

FIG. 3 is a cross-sectional view (part 1) illustrating the method of manufacturing the semiconductor device according to the embodiment.

FIG. 4 is a cross-sectional view (part 2) illustrating the method of manufacturing the semiconductor device according to the embodiment.

FIG. 6 is a cross-sectional view (part 4) illustrating the method of manufacturing the semiconductor device according to the embodiment.

FIG. 7 is a cross-sectional view (part 5) illustrating the method of manufacturing the semiconductor device according to the embodiment.

DETAILED DESCRIPTION OF THE INVENTION

Figure 1:
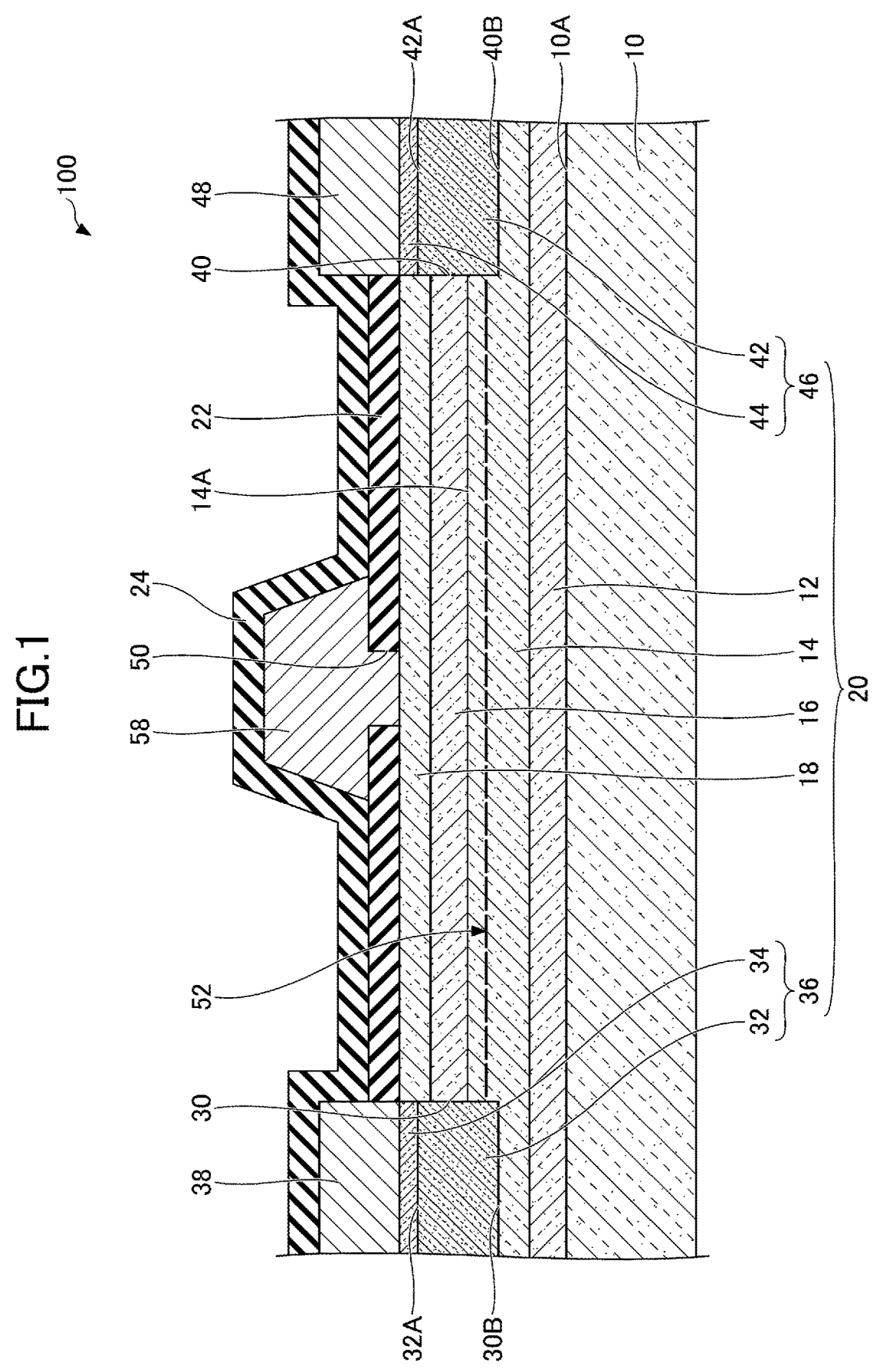
FIG. 1 is a cross-sectional view illustrating a semiconductor device according to an embodiment.

When an $n^+$GaN layer is formed by a conventional method, a decrease in throughput (the number of processed wafers per unit time when film formation is continuously performed on a plurality of wafers) is significant.

An object of the present disclosure is to provide a semiconductor device capable of reducing contact resistance while suppressing a decrease in throughput, and a method of manufacturing the semiconductor device.

Description of Embodiments of the Present Disclosure

Embodiments of the present disclosure are first listed and described.

A semiconductor device according to one aspect of the present disclosure includes a substrate including a first main surface, a semiconductor layer provided on the first main surface of the substrate, and a gate electrode, a source electrode, and a drain electrode, provided on the semiconductor layer. The semiconductor layer has an electron transit layer provided above the substrate and including a first upper surface, and an electron supply layer provided above the electron transit layer. The electron supply layer and the electron transit layer have a first opening and a second opening. A bottom surface of the first opening and a bottom surface of the second opening each exist at a deeper position toward the substrate than the first upper surface. The semiconductor layer further has a first source region containing a first electrically conductive impurity, provided on the bottom surface of the first opening, and including a second upper surface, a second source region containing the first electrically conductive impurity and provided on the second upper surface of the first source region, a first drain region containing the first electrically conductive impurity, provided on the bottom surface of the second opening, and including a third upper surface, and a second drain region containing the first electrically conductive impurity and provided on the third upper surface of the first drain region. The source electrode is provided on the second source region. The drain electrode is provided on the second drain region. A concentration of the first electrically conductive impurity in the second source region is lower than a concentration of the first electrically conductive impurity in the first source region. A concentration of the first electrically conductive impurity in the second drain region is lower than a concentration of the first electrically conductive impurity in the first drain region.

In order to suppress a decrease in throughput, the inventor of the present application has studied formation of a layer containing an impurity at a high concentration (hereinafter also referred to as a high concentration impurity layer) by a sputtering method instead of the MOCVD method. As a result, it was found that the throughput can be greatly improved. On the other hand, it was also found that when the source electrode and the drain electrode were formed on the high concentration impurity layer formed by the sputtering method, the contact resistance was higher than when the source electrode and the drain electrode were formed by the MOCVD method. Therefore, the inventor of the present application has studied to investigate the cause thereof. As a result, it was found that when the high concentration impurity layer was grown by the sputtering method, impurities were precipitated on the surface of the high concentration impurity layer as the temperature was lowered after the growth, and nitrogen compounds of impurities were produced on the surface of the high concentration impurity layer. That is, it was found that nitrogen (N) radicals used in the sputtering method reacted with the precipitated impurities.

In one aspect of the present disclosure, a first source region including a second upper surface is provided on a bottom surface of a first opening, a second source region is provided on the first source region, a first drain region including a third upper surface is provided on the bottom surface of the second opening, and a second drain region is provided on the first drain region. The bottom surface of the first opening and the bottom surface of the second opening each exist at a deeper position toward the substrate than the first upper surface. Therefore, the contact resistance can be reduced. Also, the concentration of the first electrically conductive impurity in the second source region is lower than the concentration of the first electrically conductive impurity in the first source region, and the concentration of the first electrically conductive impurity in the second drain region is lower than the concentration of the first electrically conductive impurity in the first drain region. Therefore, even if the second source region and the second drain region are formed by a sputtering method, precipitation of impurities can be suppressed, and an increase in contact resistance due to generation of nitrogen compounds as impurities can be suppressed.

[2] In [1], the electron supply layer may contain the first electrically conductive impurity at a concentration lower than the concentrations of the first electrically conductive impurities in the first source region, the second source region, the first drain region, and the second drain region. In this case, the contact resistance is easily reduced.

[3] In [1] or [2], the second source region may be thinner than the first source region. The second drain region may be thinner than the first drain region. In this case, the contact resistance is easily reduced.

[4] In [1] to [3], the first source region and the first drain region each may contain the first electrically conductive impurity at a concentration equal to 90% or higher of a solid solubility limit at 25° C. In this case, the contact resistance is easily reduced.

[5] In [1] to [4], within 90% of the first source region toward a lower side thereof in a thickness direction, a maximum value of the concentration of the first electrically conductive impurity may be less than or equal to 1.1 times a minimum value of the concentration of the first electrically conductive impurity. Within 90% of the first drain region toward a lower side thereof in a thickness direction, a maximum value of the concentration of the first electrically conductive impurity may be less than or equal to 1.1 times a minimum value of the concentration of the first electrically conductive impurity. Such a concentration profile can be easily achieved by forming the first source region and the first drain region by the sputtering method.

[6] In [1] to [5], within 90% of the second source region toward an upper side thereof in a thickness direction, a maximum value of the concentration of the first electrically conductive impurity may be less than or equal to 1.1 times a minimum value of the concentration of the first electrically conductive impurity. Within 90% of the second drain region toward an upper side thereof in a thickness direction, a maximum value of the concentration of the first electrically conductive impurity may be less than or equal to 1.1 times a minimum value of the concentration of the first electrically conductive impurity. Such a concentration profile can be easily achieved by forming the second source region and the second drain region by the sputtering method.

[7] In [1] to[6], the concentration of the first electrically conductive impurity in each of the first source region, the second source region, the first drain region, and the second drain region may be $1 \times 10^{19}$ cm$^{-3}$ or higher. In this case, the contact resistance is easily reduced.

[8] In [1] to [7], the concentration of the first electrically conductive impurity in the second source region may be less than or equal to 0.8 times the concentration of the first electrically conductive impurity in the first source region. The concentration of the first electrically conductive impurity in the second drain region may be less than or equal to 0.8 times the concentration of the first electrically conductive impurity in the first drain region. In this case, it is easy to suppress an increase in contact resistance due to the generation of the nitrogen compound.

[9] A semiconductor device according to another aspect of the present disclosure includes a substrate including a first main surface, a semiconductor layer provided on the first main surface of the substrate, and a gate electrode, a source electrode, and a drain electrode, provided on the semiconductor layer. The semiconductor layer has an electron transit layer provided above the substrate and including a first upper surface, and an electron supply layer provided above the electron transit layer. A first opening and a second opening are formed in the electron supply layer and the electron transit layer, and a bottom surface of the first opening and a bottom surface of the second opening each exist at a deeper position toward the substrate than the first upper surface. The semiconductor layer further has a first source region containing a first electrically conductive impurity, provided in the first opening, and including a second upper surface, a second source region containing the first electrically conductive impurity and provided on the second upper surface of the first source region, a first drain region containing the first electrically conductive impurity, provided in the second opening, and including a third upper surface, and a second drain region containing the first electrically conductive impurity and provided on the third upper surface of the first drain region. The source electrode is provided on the second source region. The drain electrode is provided on the second drain region. The electron supply layer contains the first electrically conductive impurity at a concentration lower than the concentrations of the first electrically conductive impurities in the first source region, the second source region, the first drain region, and the second drain region. A concentration of the first electrically conductive impurity in the second source region is lower than a concentration of the first electrically conductive impurity in the first source region. A concentration of the first electrically conductive impurity in the second drain region is lower than a concentration of the first electrically conductive impurity in the first drain region. The second source region is thinner than the first source region. The second drain region is thinner than the first drain region. The first source region and the first drain region each contain the first electrically conductive impurity at a concentration equal to 90% or higher of a solid solubility limit at 25° C.

[10] A method of manufacturing a semiconductor device according to another aspect of the present disclosure includes a step of forming a semiconductor layer on a first main surface of a substrate, and a step of forming a gate electrode, a source electrode, and a drain electrode on the semiconductor layer. The step of forming the semiconductor layer includes a step of forming an electron transit layer including a first upper surface above the substrate, a step of forming an electron supply layer above the electron transit layer, a step of forming a first opening and a second opening in the electron supply layer and the electron transit layer, a step of forming a first source region containing a first electrically conductive impurity and including a second upper surface on a bottom surface of the first opening and forming a first drain region containing the first electrically conductive impurity and including a third upper surface on a bottom surface of the second opening, and a step of forming a second source region containing the first electrically conductive impurity on the second upper surface of the first source region and forming a second drain region containing the first electrically conductive impurity on the third upper surface of the first drain region. The bottom surface of the first opening and the bottom surface of the second opening are each provided at a deeper position toward the substrate than the first upper surface. The source electrode is provided on the second source region. The drain electrode is provided on the second drain region. A concentration of the first electrically conductive impurity in the second source region is lower than a concentration of the first electrically conductive impurity in the first source region. A concentration of the first electrically conductive impurity in the second drain region is lower than a concentration of the first electrically conductive impurity in the first drain region.

[11] In [10], the step of forming the first source region and the first drain region and the step of forming the second source region and the second drain region include a step of forming a layered structure by forming a first semiconductor layer on the bottom surface of the first opening and the bottom surface of the second opening, and then forming a second semiconductor layer on the first semiconductor layer, while doping the first semiconductor layer and the second semiconductor layer with the first electrically conductive impurity. In the step of forming the layered structure, until formation of the second semiconductor layer is completed, a temperature of the substrate may be maintained at higher than or equal to a temperature at which the first electrically conductive impurity with which each of the first semiconductor layer and the second semiconductor layer have been doped is kept in a solid solution state with the first semiconductor layer and the second semiconductor layer. In this case, it is easy to suppress generation of nitrogen compounds as impurities in the layered structure.

Details of Embodiment of the Present Disclosure

Hereinafter, embodiments of the present disclosure will be described in detail, but the present disclosure is not limited thereto. In the specification and the drawings, components having substantially the same functional configuration are denoted by the same reference numerals, and redundant description thereof may be omitted.

The present embodiment relates to a semiconductor device including a GaN-HEMT having a nitride semiconductor as a main constituent material. FIG. 1 is a cross-sectional view illustrating a semiconductor device according to an embodiment.

As shown in FIG. 1, a semiconductor device 100 according to the present embodiment includes a substrate 10 including a first main surface 10A and a multi-layer structure 20 of a plurality of semiconductor layers provided on first main surface 10A. Substrate 10 is a SiC substrate having, for example, a (0001) principal surface as first main surface 10A, and the lamination direction of multi-layer structure 20 is, for example, a [0001]direction. Multi-layer structure 20 includes a buffer layer 12, an electron transit layer 14, an electron supply layer 16, and a cap layer 18, which are sequentially formed from substrate 10 side. Buffer layer 12 is, for example, an AlN layer having a thickness of 5 nm or more and 100 nm or less. Electron transit layer 14 is, for example, an undoped GaN layer that has a thickness of about 1000 nm. Electron supply layer 16 is, for example, an n-type AlGaN layer having a thickness of about 20 nm. Cap layer 18 is, for example, an n-type GaN layer having a thickness of about 5 nm. The n-type impurity used in the present embodiment is, for example, Si or Ge. Multi-layer structure 20 is an example of a semiconductor layer.

An insulating film 22 is formed on multi-layer structure 20. Insulating film 22 is, for example, an Si nitride film. A first opening 30 for a source and a second opening 40 for a drain are formed in insulating film 22 and multi-layer structure 20. First opening 30 and second opening 40 are formed at a deeper position than an upper surface 14A of electron transit layer 14. A bottom surface 30B of first opening 30 and a bottom surface 40B of second opening 40 are closer to first main surface 10A than upper surface 14A of electron transit layer 14. Upper surface 14A is an example of a first upper surface. Bottom surface 30B of first opening 30 and bottom surface 40B of second opening 40 exist at a deeper position toward substrate 10 than upper surface 14A.

Multi-layer structure 20 is formed in first opening 30. Multi-layer structure 20 includes a first source region 32 having an upper surface 32A, and a second source region 34 provided on upper surface 32A. First source region 32 is provided on bottom surface 30B of first opening 30. First source region 32 and second source region 34 are included in a source regrowth layer 36. First source region 32 and second source region 34 are, for example, n-type GaN layers. First source region 32 and second source region 34 contain, for example, an n-type impurity at a higher concentration than electron supply layer 16. That is, electron supply layer 16 contains the n-type impurity at a lower concentration than first source region 32 and second source region 34. Accordingly, the electrical resistance of each of first source region 32 and second source region 34 is lower than the electrical resistance of electron supply layer 16. The concentration of the n-type impurity in each of first source region 32 and second source region 34 is, for example, $1\times10^{19}$ cm$^{-3}$ or higher. Upper surface 32A is farther from first main surface 10A than upper surface 14A. Second source region 34 is preferably thinner than first source region 32. Upper surface 32A is an example of a second upper surface.

Figure 2:
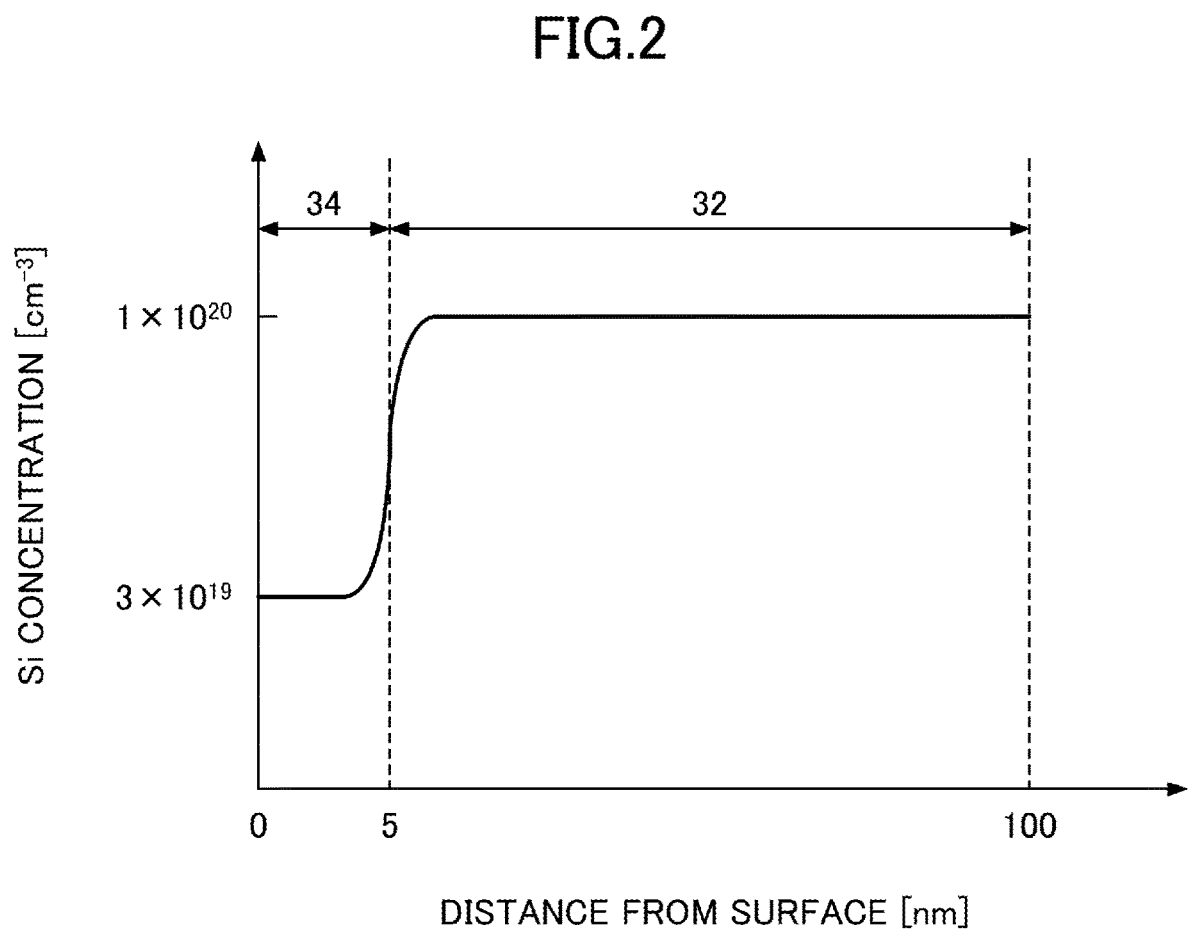

First source region 32 contains an n-type impurity at a higher concentration than second source region 34. That is, the concentration of the n-type impurity in second source region 34 is lower than the concentration of the n-type impurity in first source region 32. For example, first source region 32 contains an n-type impurity at a concentration equal to 90% or higher of the solid solubility limit at 25° C. Although details will be described later, source regrowth layer 36 is formed by a sputtering method. FIG. 2 illustrates an example of a concentration profile of an n-type impurity in source regrowth layer 36. Here, Si is used as the n-type impurity. In FIG. 2, the horizontal axis represents distances from the surfaces of source regrowth layers 36, and the vertical axis represents Si concentration in source regrowth layers 36. For example, the total thickness of source regrowth layer 36 is 100 nm.

As shown in FIG. 2, the Si concentration may continuously change between first source region 32 and second source region 34. In the present disclosure, when the concentration of the n-type impurity (Si or the like) continuously changes, it is assumed that the boundary between first source region 32 and second source region 34 exists in a portion where the concentration of the n-type impurity is an average value of the concentration of the n-type impurity on the lower surface of source regrowth layer 36 and the concentration of the n-type impurity on the upper surface. In the example shown in FIG. 2, since the Si concentration on the lower surface of source regrowth layer 36 is $1\times10^{20}$ cm$^{-3}$ and the Si concentration on the upper surface is $3\times10^{19}$ cm$^{-3}$ or higher, there is a boundary between first source region 32 and second source region 34 in a portion where Si concentration is $6.5\times10^{19}$ cm$^{-3}$. For example, first source region 32 is 95 nm thick and second source region 34 is 5 nm thick.

The concentration of the n-type impurity may be uniform within 90% of the first source region 32 toward the lower side thereof in the thickness direction (i.e., the side on which the distance from the surface is greater on the horizontal axis illustrated in FIG. 2).

For example, the maximum value of the concentration of the n-type impurity may be less than or equal to 1.1 times the minimum value of the n-type impurity within 90% of the first source region 32 toward the lower side thereof in the thickness direction. In addition, the concentration of the n-type impurity may be uniform within 90% of the second source region 34 toward the upper side thereof in the thickness direction (i.e., the side on which the distance from the surface is less on the horizontal axis illustrated in FIG. 2). For example, the maximum value of the concentration of the n-type impurity may be less than or equal to 1.1 times the minimum value of the n-type impurity within upper 90% of the second source region 34 in the thickness direction thereof. Further, the concentration of the n-type impurity at the lower surface of first source region 32 may be higher than the concentration of the n-type impurity at the upper surface, and the concentration of the n-type impurity at the lower surface of second source region 34 may be higher than the concentration of the n-type impurity at the upper surface.

Multi-layer structure 20 is formed in second opening 40. Multi-layer structure 20 includes a first drain region 42 having an upper surface 42A, and a second drain region 44 provided on upper surface 42A. First drain region 42 is provided on bottom surface 40B of second opening 40. First drain region 42 and second drain region 44 are included in a drain regrowth layer 46. First drain region 42 and second drain region 44 are, for example, n-type GaN layers. First drain region 42 and second drain region 44 contain, for example, an n-type impurity at a higher concentration than electron supply layer 16. That is, electron supply layer 16 contains the n-type impurity at a lower concentration than first drain region 42 and second drain region 44. Accordingly, the electrical resistance of each of first drain region 42 and second drain region 44 is lower than the electrical resistance of electron supply layer 16. The concentration of the n-type impurity in each of first drain region 42 and second drain region 44 is, for example, $1\times10^{19}$ cm$^{-3}$ or higher. Upper surface 42A is farther from first main surface 10A than upper surface 14A. Second drain region 44 is preferably thinner than first drain region 42. Upper surface 42A is an example of a third upper surface.

First drain region 42 contains an n-type impurity at a higher concentration than second drain region 44. That is, the concentration of the n-type impurity in second drain region 44 is lower than the concentration of the n-type impurity in first drain region 42. For example, first drain region 42 contains an n-type impurity at a concentration equal to 90% or higher of the solid solubility limit at 25° C. Although details will be described later, drain regrowth layer 46 is also formed by a sputtering method. For example, the concentration profile of the n-type impurity in drain regrowth layer 46 is similar to the example of the concentration profile of the n-type impurity in source regrowth layer 36 illustrated in FIG. 2. For example, the total thickness of drain regrowth layer 46 is 100 nm.

The Si concentration may continuously change between first drain region 42 and second drain region 44. In the present disclosure, when the concentration of the n-type impurity (Si or the like) continuously changes, it is assumed that the boundary between first drain region 42 and second drain region 44 exists in a portion where the concentration of the n-type impurity is an average value of the concentration of the n-type impurity on the lower surface of drain regrowth layer 46 and the concentration of the n-type impurity on the upper surface. For example, in a case where the Si concentration on the lower surface of drain regrowth layer 46 is $1\times10^{20}$ cm$^{-3}$ and the Si concentration on the upper surface is $3\times10^{19}$ cm$^{-3}$ or higher, there is a boundary between first drain region 42 and second drain region 44 in a portion where Si concentration is $6.5\times10^{19}$ cm$^{-3}$. For example, first drain region 42 has a thickness of 95 nm and second drain region 44 has a thickness of 5 nm.

The concentration of the n-type impurity may be uniform within 90% of the first drain region 42 toward the lower side thereof in the thickness direction. For example, the maximum value of the concentration of the n-type impurity may be less than or equal to 1.1 times the minimum value of the n-type impurity within 90% of the first drain region 42 toward the lower side thereof in the thickness direction. In addition, the concentration of the n-type impurity may be uniform within 90% of the second drain region 44 toward the upper side thereof in the thickness direction. For example, the maximum value of the concentration of the n-type impurity may be less than or equal to 1.1 times the minimum value of the n-type impurity within upper 90% of the second drain region 44 in the thickness direction thereof. Further, the concentration of the n-type impurity at the lower surface of first drain region 42 may be higher than the concentration of the n-type impurity at the upper surface, and the concentration of the n-type impurity at the lower surface of second drain region 44 may be higher than the concentration of the n-type impurity at the upper surface.

Semiconductor device 100 includes a source electrode 38 provided on second source region 34 and a drain electrode 48 provided on second drain region 44. Source electrode 38 and drain electrode 48 include, for example, a Ta film and an Al film. A third opening 50 for a gate is formed in insulating film 22 between source electrode 38 and drain electrode 48. A portion of the surface of multi-layer structure 20 is exposed through third opening 50. Semiconductor device 100 has a gate electrode 58 in contact with multi-layer structure 20 through third opening 50. Gate electrode 58 includes, for example, a Ni film and an Au film. Gate electrode 58 has, for example, a T-shape in cross-sectional view. Semiconductor device 100 further includes an insulating film 24 covering gate electrode 58, source 38, and drain electrode 48. Insulating film 24 is, for example, an Al oxide film or an Si nitride film.

In semiconductor device 100, a 2DEG 52 is present near upper surface 14A of electron transit layer 14. Source electrode 38 is in ohmic contact with 2DEG 52 via source regrowth layer 36, and drain electrode 48 is in ohmic contact with 2DEG 52 via drain regrowth layer 46. Therefore, it is possible to reduce contact resistance which is resistance components from each of source electrode 38 and drain electrode 48 to 2DEG 52.

First source region 32, second source region 34, first drain region 42, and second drain region 44 can be formed by a sputtering method. By forming first source region 32, second source region 34, first drain region 42, and second drain region 44 by the sputtering method, it is possible to suppress a decrease in throughput compared to the case of forming them by the MOCVD method. Since the MOCVD method generally requires a longer film formation time than the sputtering method due to a difference in the principle of the film formation method, it is considered that the throughput (the number of processed wafers per unit time when film formation is continuously performed on a plurality of wafers) is lower. Furthermore, even when first source region 32, second source region 34, first drain region 42, and second drain region 44 are formed by the sputtering method, the formation of nitrogen compounds on the surfaces of second source region 34 and second drain region 44 is suppressed compared to the MOCVD method, and thus an increase in contact resistance due to the formation of nitrogen compounds can be suppressed.

In the present embodiment, electron supply layer 16 contains n-type impurities at a concentration lower than first source region 32, second source region 34, first drain region 42, and second drain region 44. Therefore, it is easy to reduce the contact resistance of source electrode 38 and drain electrode 48.

Further, second source region 34 is thinner than first source region 32, and second drain region 44 is thinner than first drain region 42. Therefore, the ratio occupied by second source region 34 in source regrowth layer 36 and the ratio occupied by second drain region 44 in drain regrowth layer 46 are low, and the contact resistance of source electrode 38 and drain electrode 48 is easily reduced.

In addition, first source region 32 and first drain region 42 preferably contain the n-type impurity at a concentration equal to 90% or higher of the solid solubility limit at 25° C., and preferably contain the n-type impurity at a concentration of 95% or higher. This is to facilitate reduction of the contact resistance of source electrode 38 and drain electrode 48.

Within 90% of the first source region 32 toward the lower side thereof in the thickness direction, the maximum value of the concentration of the n-type impurity may be less than or equal to 1.1 times the minimum value of the n-type impurity, and within 90% of the first drain region 42 toward the lower side thereof in the thickness direction, the maximum value of the concentration of the n-type impurity may be less than or equal to 1.1 times the minimum value of the n-type impurity. In addition, within 90% of the second source region 34 toward the upper side thereof in the thickness direction, the maximum value of the concentration of the n-type impurity may be less than or equal to 1.1 times the minimum value of the n-type impurity, within 90% of the second drain region 44 toward the upper side thereof in the thickness direction, the maximum value of the concentration of the n-type impurity may be less than or equal to 1.1 times the minimum value of the n-type impurity. As will be described later, when source regrowth layer 36 and drain regrowth layer 46 are formed by the sputtering method, such a concentration profile can be easily realized.

The concentration of the n-type impurity in each of first source region 32, second source region 34, first drain region 42, and second drain region 44 is preferably $1 \times 10^{19}$ cm$^{-3}$ or higher, more preferably $2 \times 10^{19}$ cm$^{-3}$ or higher, and still more preferably $3 \times 10^{19}$ cm$^{-3}$ or higher. This is to facilitate reduction of the contact resistance of source electrode 38 and drain electrode 48.

The concentration of n-type impurities in second source region 34 and the concentration of n-type impurities in second drain region 44 are preferably less than or equal to 0.8 times, more preferably less than or equal to 0.6 times, and still more preferably less than or equal to 0.4 times the concentration of n-type impurities in first source region 32 and the concentration of n-type impurities in first drain region 42, respectively. This is to facilitate suppression of an increase in contact resistance due to generation of a nitrogen compound.

The material of source regrowth layer 36 and drain regrowth layer 46 is not limited to GaN. The material of a layered structure 66 may be AlGaN, AlN, InAlN, InAlGaN, or the like.

Next, a method of manufacturing semiconductor device 100 according to the embodiment will be described. FIG. 3 to FIG. 9 are cross-sectional views illustrating a method of manufacturing a semiconductor device according to an embodiment.

Figure 3:
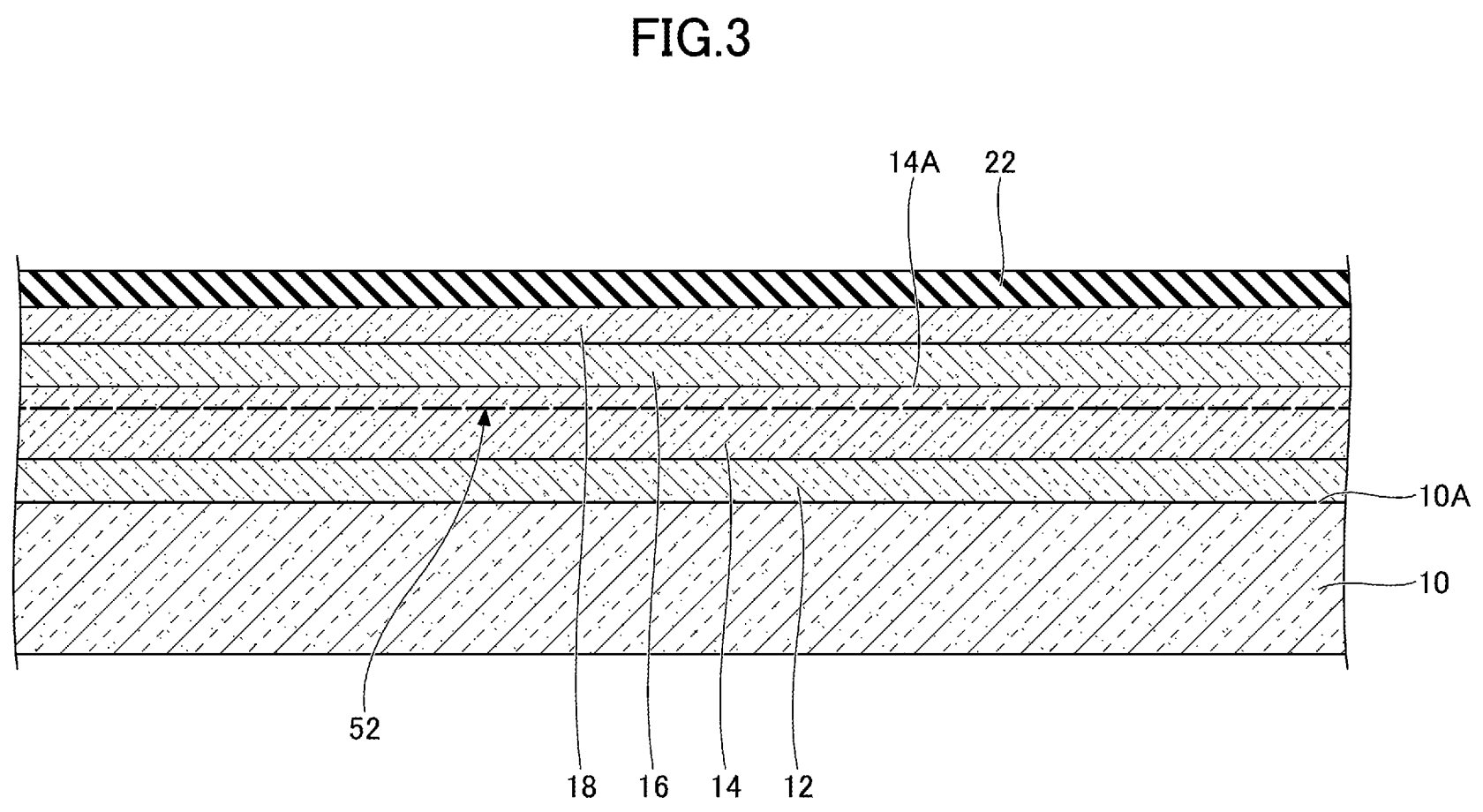

Referring to FIG. 3, buffer layer 12, electron transit layer 14, electron supply layer 16, and cap layer 18 are formed on substrate 10. Buffer layer 12, electron transit layer 14, electron supply layer 16, and cap layer 18 are formed by, for example, an MOCVD method. Next, insulating film 22 is formed on cap layer 18.

Figure 4:
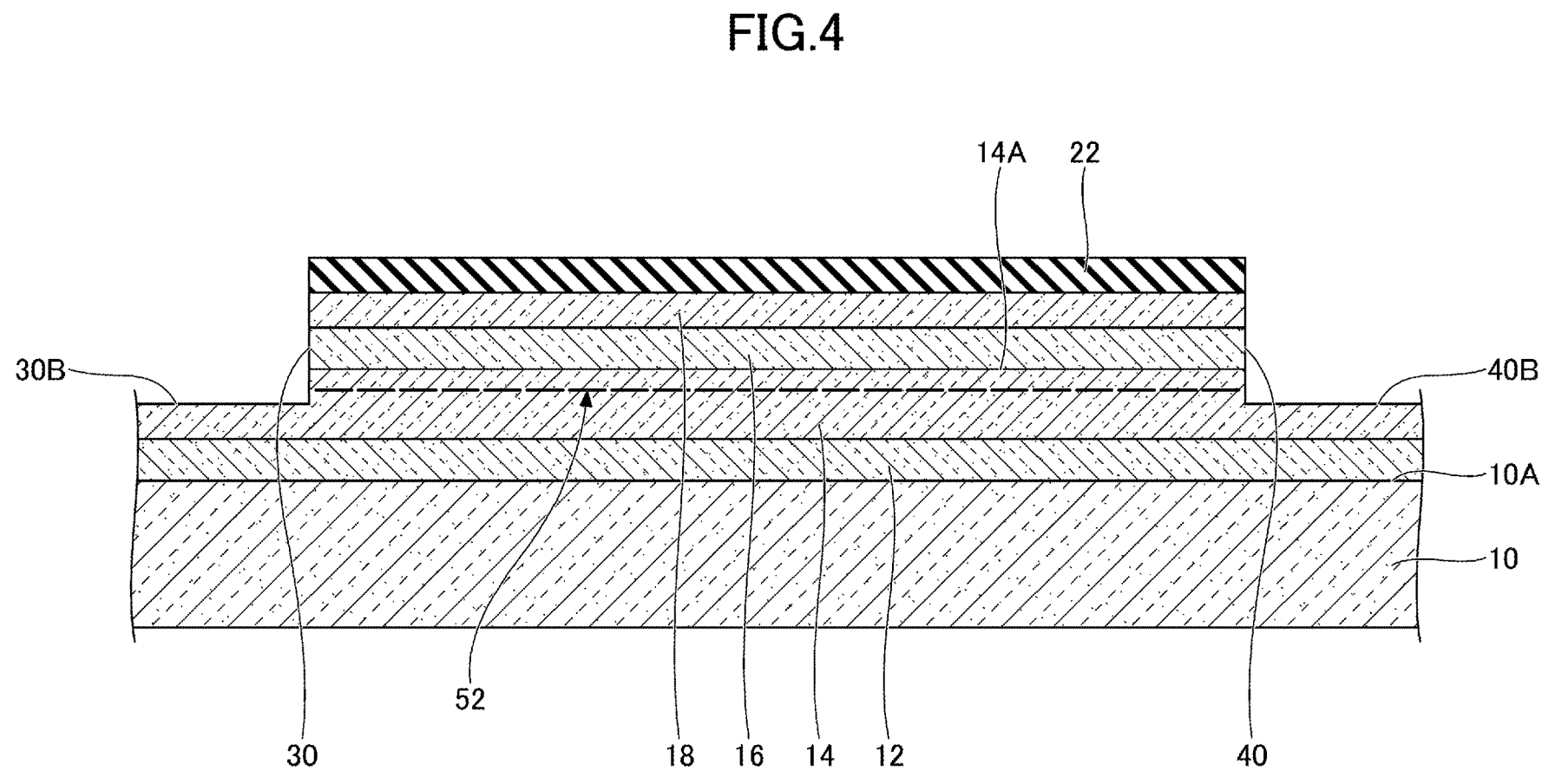

Next, as shown in FIG. 4, first opening 30 and second opening 40 are formed in insulating film 22, cap layer 18, electron supply layer 16, and electron transit layer 14. Bottom surface 30B of first opening 30 and bottom surface 40B of second opening 40 are provided at a deeper position toward substrate 10 side than upper surface 14A. In the formation of first opening 30 and second opening 40, reactive ion etching (RIE) is performed using, for example, an electron beam resist (not shown) as a mask. A reactive gas containing fluorine (F) may be used to etch insulating film 22, and a reactive gas containing chlorine (Cl) may be used to etch cap layer 18, electron supply layer 16, and electron transit layer 14.

Figure 5:
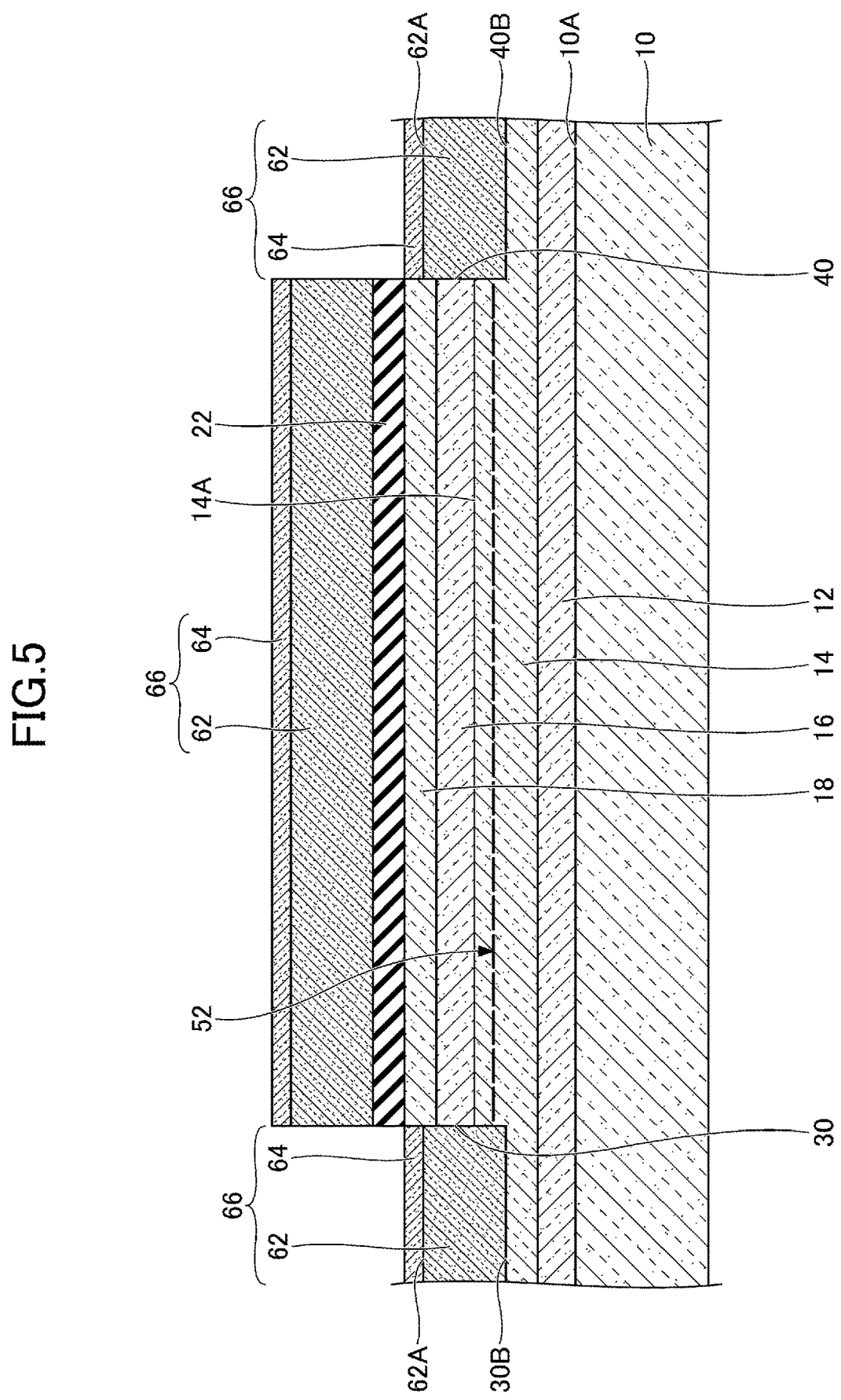
FIG. 5 is a cross-sectional view (part 3) illustrating the method of manufacturing the semiconductor device according to the embodiment.

Next, as shown in FIG. 5, layered structure 66 of a first semiconductor layer 62 and a second semiconductor layer 64 is formed in first opening 30 and second opening 40 by a sputtering method. First semiconductor layer 62 is formed on bottom surface 30B of first opening 30 and on bottom surface 40B of second opening 40. N radicals are used as an irradiation source in the formation of layered structure 66. As a sputtering gas, for example, Ar, Kr, or Xe is used. Layered structure 66 grows in first opening 30 and second opening 40 while being lattice-matched to electron transit layer 14. In first opening 30 and second opening 40, the thickness of first semiconductor layer 62 is adjusted so that an upper surface 62A of first semiconductor layer 62 is farther from first main surface 10A of substrate 10 than upper surface 14A of electron transit layer 14. Layered structure 66 is also formed on insulating film 22. Layered structure 66 on insulating film 22 is, for example, polycrystalline. First semiconductor layer 62 and second semiconductor layer 64 are, for example, n-type GaN layers. First semiconductor layer 62 and second semiconductor layer 64 contain, for example, n-type impurities at a concentration higher than that of electron supply layer 16. The concentration of the n-type impurity in each of first semiconductor layer 62 and second semiconductor layer 64 is, for example, $1\times10^{19}$ cm$^{-3}$ or higher. The upper surface of first semiconductor layer 62 is an example of a fourth upper surface.

When layered structure 66 is formed, the temperature of substrate 10 is maintained at a temperature at which first semiconductor layer 62 and second semiconductor layer 64 can grow. First semiconductor layer 62 and second semiconductor layer 64 are grown while being doped with an n-type impurity such as Si. When second semiconductor layer 64 is formed, the supply amount of the n-type impurity is made lower than when first semiconductor layer 62 is formed, and the concentration of the n-type impurity in second semiconductor layer 64 is made lower than the concentration of the n-type impurity in first semiconductor layer 62. By setting the concentration of the n-type impurity in second semiconductor layer 64 to be lower than the concentration of the n-type impurity in first semiconductor layer 62, even if the temperature of substrate 10 is lowered after formation of second semiconductor layer 64, precipitation of Si in layered structure 66 is suppressed, and generation of a nitrogen compound of the n-type impurity on the upper surface of second semiconductor layer 64 can be suppressed. For example, the concentration profile of the n-type impurity in layered structure 66 is similar to the example of the concentration profile of the n-type impurity in source regrowth layer 36 illustrated in FIG. 2.

When forming layered structure 66, it is preferable to keep the temperature of substrate 10 at a temperature at which the n-type impurity doped in first semiconductor layer 62 and second semiconductor layer 64 is maintained in a solid solution state in first semiconductor layer 62 and second semiconductor layer 64 or higher, for example, 600° C. or higher until the formation of second semiconductor layer 64 is completed. By performing such temperature control, it is possible to suppress generation of a nitrogen compound of an n-type impurity in layered structure 66.

Figure 6:
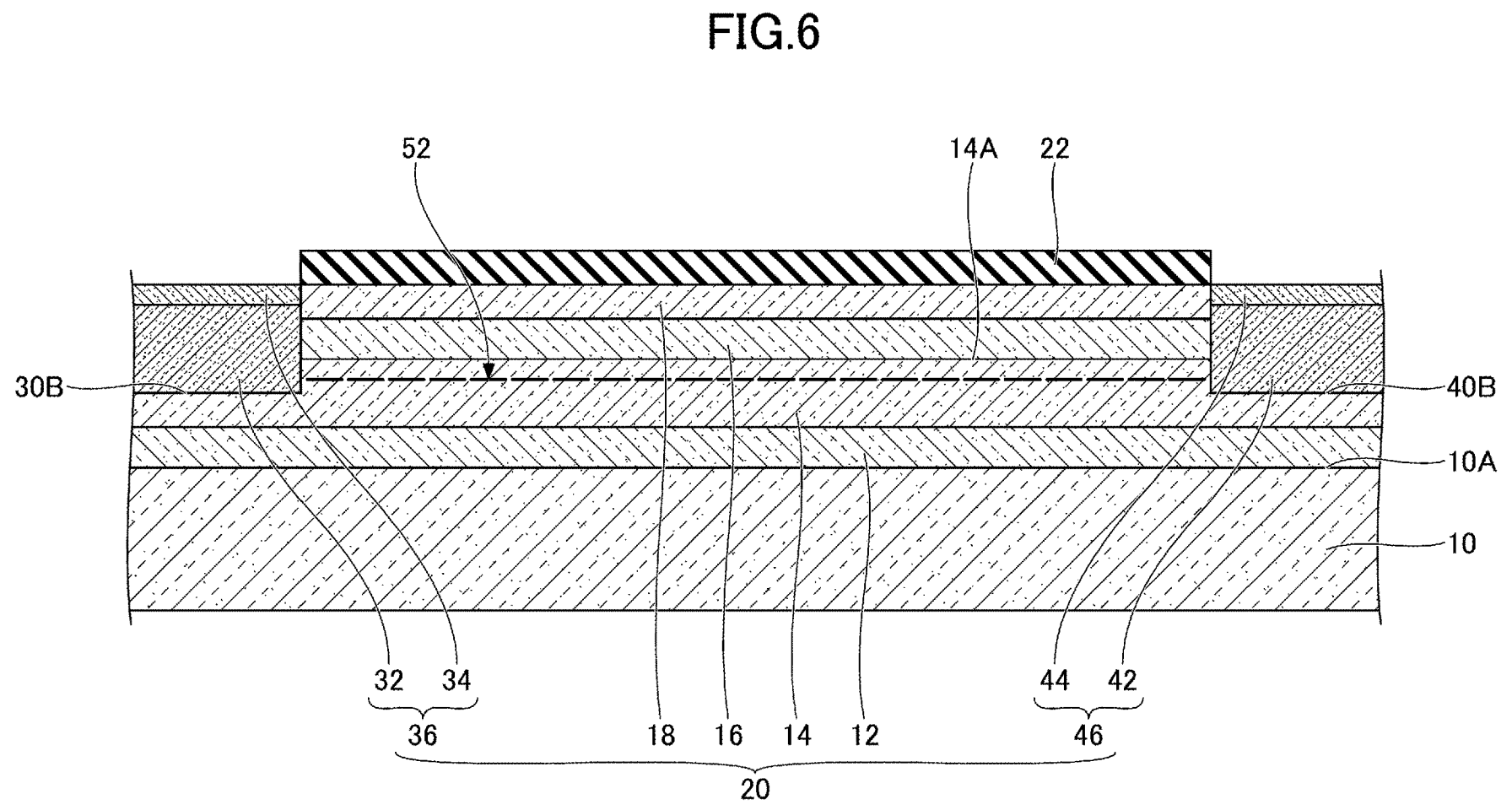

Thereafter, as illustrated in FIG. 6, layered structure 66 on insulating film 22 is removed. Layered structure 66 on insulating film 22 can be removed using, for example, tetramethylammonium hydroxide (TMAH). The portion of layered structure 66 in first opening 30 and the portion in second opening 40 are not removed, and source regrowth layer 36 including first source region 32 and second source region 34 is obtained in first opening 30, and drain regrowth layer 46 including first drain region 42 and second drain region 44 is obtained in second opening 40.

Figure 7:
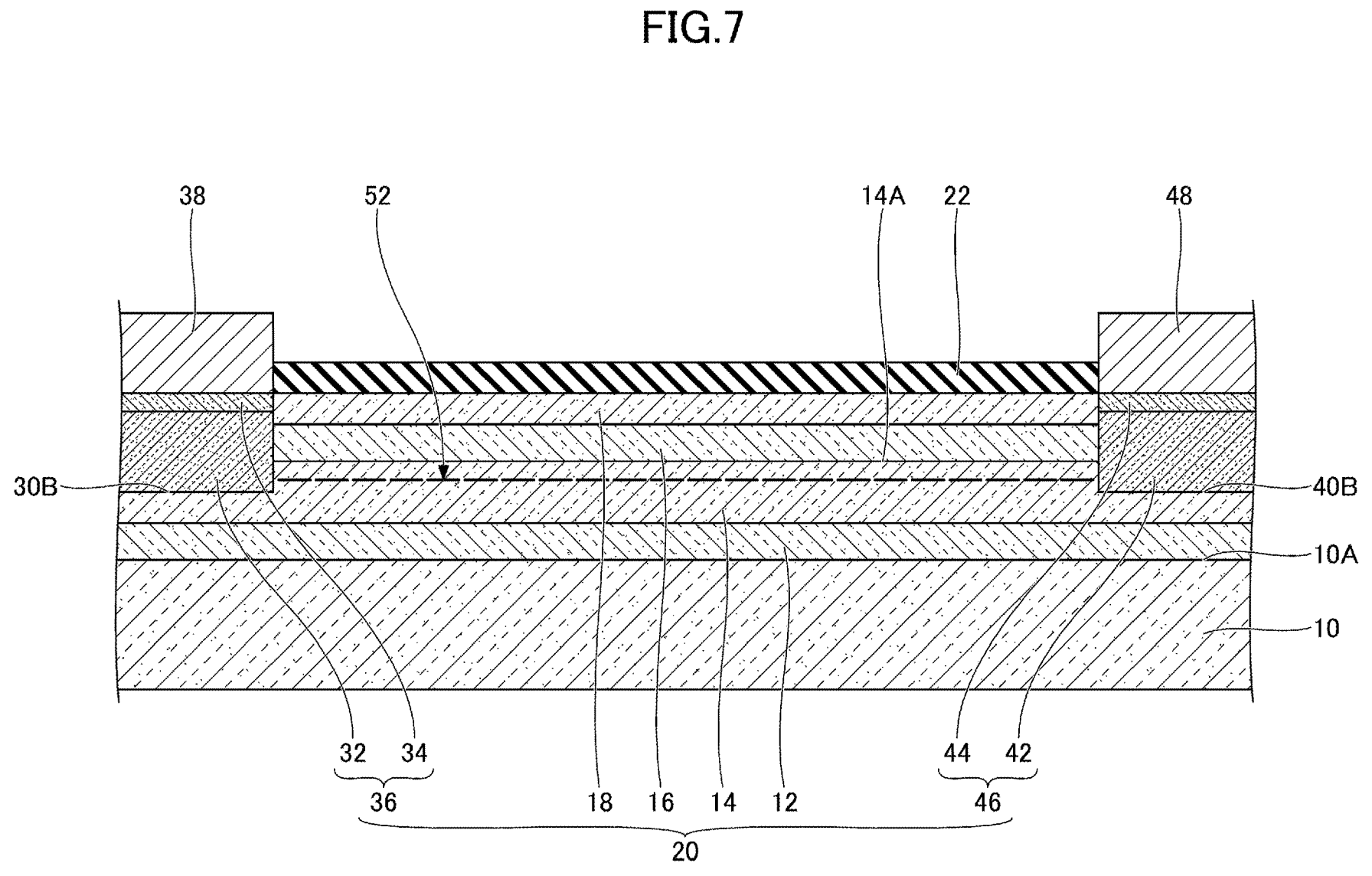

Next, as illustrated in FIG. 7, source electrode 38 is formed on second source region 34, and drain electrode 48 is formed on second drain region 44. Source electrode 38 and drain electrode 48 may be formed, for example, by vapor deposition, lift-off, and alloying heat treatment. Source electrode 38 and drain electrode 48 include, for example, a Ta film and an Al film. Source electrode 38 and drain electrode 48 are in ohmic contact with 2DEG 52 via source regrowth layer 36 and drain regrowth layer 46, respectively.

Figure 8:
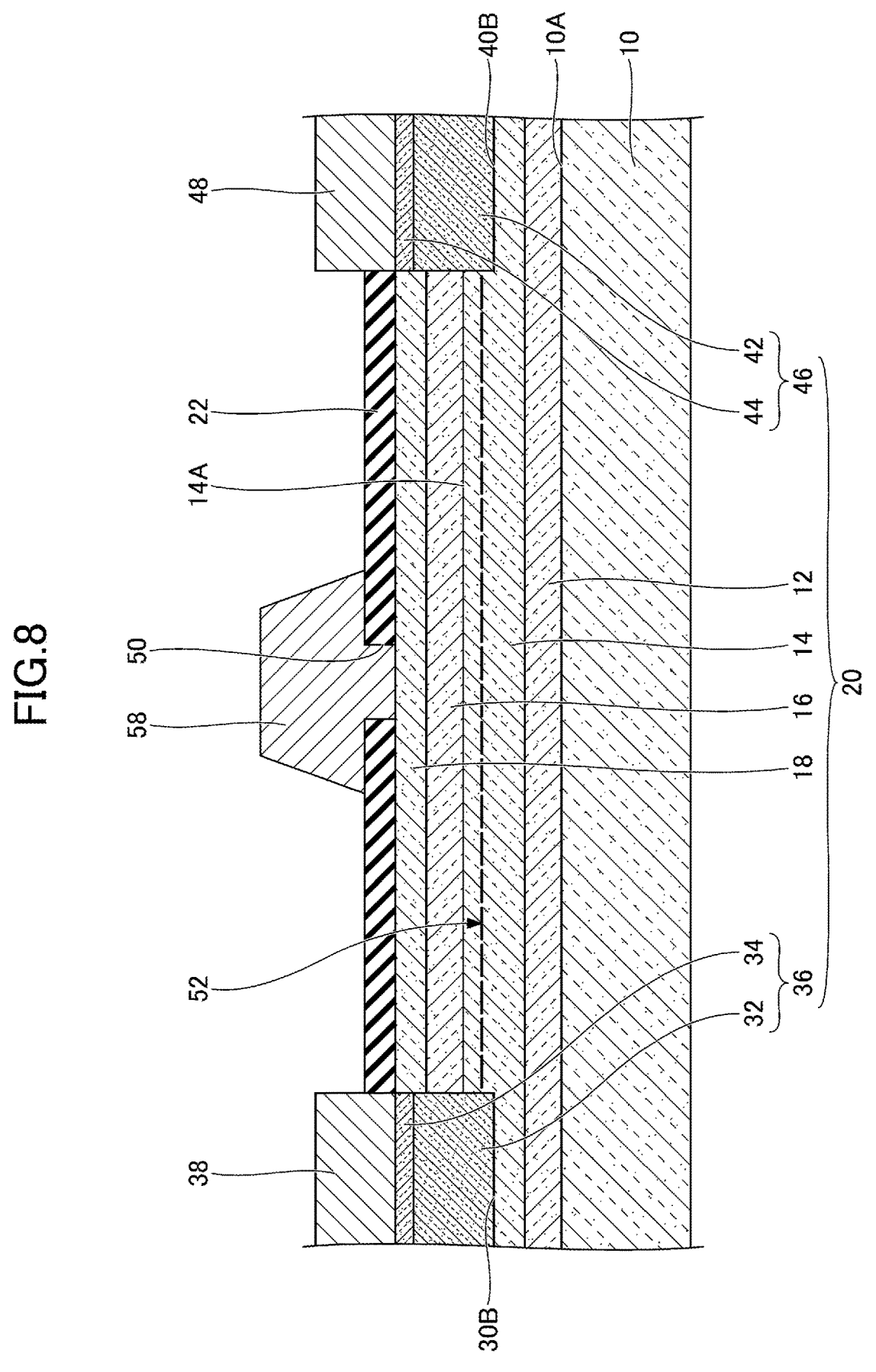
FIG. 8 is a cross-sectional view (part 6) illustrating the method for manufacturing the semiconductor device according to the embodiment.

Next, as illustrated in FIG. 8, third opening 50 is formed in insulating film 22. In the formation of third opening 50, RIE is performed using, for example, an electron beam resist (not shown) as a mask. A reactive gas containing F is used for etching insulating film 22. Next, gate electrode 58 is formed on insulating film 22. Gate electrode 58 can be formed by, for example, vapor deposition and lift-off. Gate electrode 58 includes, for example, a Ni film and an Au film.

Figure 9:
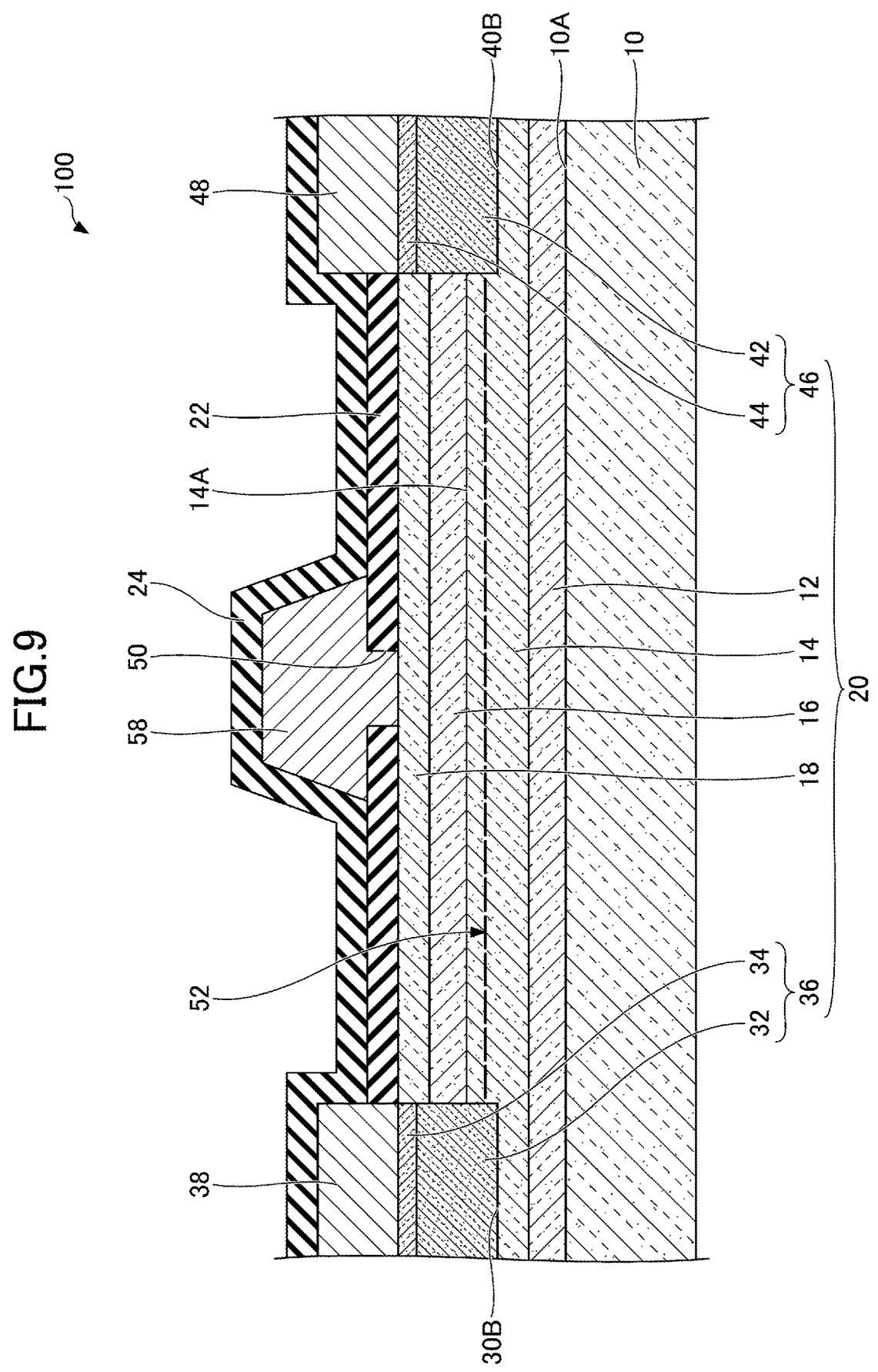
FIG. 9 is a cross-sectional view (part 7) illustrating the method of manufacturing the semiconductor device according to the embodiment.

Next, as illustrated in FIG. 9, insulating film 24 is formed to cover gate electrode 58, source electrode 38, and drain electrode 48. The Al oxide film can be formed by, for example, an ALD method. The Si nitride film can be formed by, for example, a plasma CVD method.

Thereafter, wiring and the like are formed as necessary. In this manner, semiconductor device 100 including the GaN-HEMT can be manufactured.

According to this manufacturing method, since first semiconductor layer 62 and second semiconductor layer 64 are formed by the sputtering method, the throughput can be improved compared to the case of forming them by the MOCVD method. Furthermore, by making the concentration of the n-type impurity in second semiconductor layer 64 lower than the concentration of the n-type impurity in first semiconductor layer 62, even if the temperature of substrate 10 is lowered after the formation of second semiconductor layer 64, it is possible to suppress the generation of nitrogen compounds of the n-type impurity on the upper surface of second semiconductor layer 64. Therefore, it is possible to suppress an increase in contact resistance due to the generation of the nitrogen compound.

As described above, Ar, Kr, or Xe is used when forming layered structure 66. Therefore, Ar, Kr, or Xe may remain in source regrowth layer 36 and drain regrowth layer 46. In general, since the nitride semiconductor layer formed by the MOCVD method does not contain Ar, Kr, or Xe, whether source regrowth layer 36 and drain regrowth layer 46 are formed by the sputtering method or the MOCVD method can be determined based on whether Ar, Kr, or Xe remains.

The concentration of impurities in the semiconductor layer can be measured by, for example, secondary ion mass spectrometry (SIMS).

Although the embodiments have been described in detail above, the present invention is not limited to the specific embodiments, and various modifications and changes can be made within the scope described in the claims.

What is claimed is:

1. A semiconductor device comprising:
   a substrate including a first main surface;
   a semiconductor layer provided on the first main surface of the substrate; and a gate electrode, a source electrode, and a drain electrode, provided on the semiconductor layer, wherein the semiconductor layer has an electron transit layer provided above the substrate and including a first upper surface, and an electron supply layer provided above the electron transit layer, wherein the electron supply layer and the electron transit layer have a first opening and a second opening, and a bottom surface of the first opening and a bottom surface of the second opening each exist at a deeper position toward the substrate than the first upper surface, wherein the semiconductor layer further has a first source region containing a first electrically conductive impurity, provided on the bottom surface of the first opening, and including a second upper surface, a second source region containing the first electrically conductive impurity and provided on the second upper surface of the first source region, a first drain region containing the first electrically conductive impurity, provided on the bottom surface of the second opening, and including a third upper surface, and a second drain region containing the first electrically conductive impurity and provided on the third upper surface of the first drain region, wherein the source electrode is provided on the second source region, wherein the drain electrode is provided on the second drain region, wherein a concentration of the first electrically conductive impurity in the second source region is lower than a concentration of the first electrically conductive impurity in the first source region, wherein a concentration of the first electrically conductive impurity in the second drain region is lower than a concentration of the first electrically conductive impurity in the first drain region, wherein at least one of the first source region, the second source region, the first drain region, and the second drain region contains a rare gas element selected from the group consisting of Ar, Kr, or Xe, and wherein a nitride compound of the first electrically conductive impurity is present on each of the second upper surface of the first source region and the third upper surface of the first drain region.

2. The semiconductor device according to claim 1, wherein the electron supply layer contains the first electrically conductive impurity at a concentration lower than the concentrations of the first electrically conductive impurities in the first source region, the second source region, the first drain region, and the second drain region.

3. The semiconductor device according to claim 1, wherein the second source region is thinner than the first source region, and wherein the second drain region is thinner than the first drain region.

4. The semiconductor device according to claim 1, wherein the first source region and the first drain region each contain the first electrically conductive impurity at a concentration equal to 90% or higher of a solid solubility limit at 25° C.

5. The semiconductor device according to claim 1, wherein, within 90% of the first source region toward a lower side thereof in a thickness direction, a maximum value of the concentration of the first electrically conductive impurity is less than or equal to 1.1 times a minimum value of the concentration of the first electrically conductive impurity, and wherein, within 90% of the first drain region toward a lower side thereof in a thickness direction, a maximum value of the concentration of the first electrically conductive impurity is less than or equal to 1.1 times a minimum value of the concentration of the first electrically conductive impurity.

6. The semiconductor device according to claim 1, wherein, within 90% of the second source region toward an upper side thereof in a thickness direction, a maximum value of the concentration of the first electrically conductive impurity is less than or equal to 1.1 times a minimum value of the concentration of the first electrically conductive impurity, and wherein, within 90% of the second drain region toward an upper side thereof in a thickness direction, a maximum value of the concentration of the first electrically conductive impurity is less than or equal to 1.1 times a minimum value of the concentration of the first electrically conductive impurity.

7. The semiconductor device according to claim 1, wherein the concentration of the first electrically conductive impurity in each of the first source region, the second source region, the first drain region, and the second drain region is $1 \times 10^{19}$ cm$^{-3}$ or higher.

8. The semiconductor device according to claim 1, wherein the concentration of the first electrically conductive impurity in the second source region is less than or equal to 0.8 times the concentration of the first electrically conductive impurity in the first source region, and wherein the concentration of the first electrically conductive impurity in the second drain region is less than or equal to 0.8 times the concentration of the first electrically conductive impurity in the first drain region.

9. A semiconductor device comprising:

a substrate including a first main surface;

a semiconductor layer provided on the first main surface of the substrate; and a gate electrode, a source electrode, and a drain electrode, provided on the semiconductor layer, wherein the semiconductor layer has an electron transit layer provided above the substrate and including a first upper surface, and an electron supply layer provided above the electron transit layer, wherein the electron supply layer and the electron transit layer have a first opening and a second opening, and a bottom surface of the first opening and a bottom surface of the second opening each exist at a deeper position toward the substrate than the first upper surface, wherein the semiconductor layer further has a first source region containing a first electrically conductive impurity, provided in the first opening, and including a second upper surface, a second source region containing the first electrically conductive impurity and provided on the second upper surface of the first source region, a first drain region containing the first electrically conductive impurity, provided in the second opening, and including a third upper surface, and a second drain region containing the first electrically conductive impurity and provided on the third upper surface of the first drain region, wherein the source electrode is provided on the second source region, wherein the drain electrode is provided on the second drain region, wherein the electron supply layer contains the first electrically conductive impurity at a concentration lower than the concentrations of the first electrically conductive impurities in the first source region, the second source region, the first drain region, and the second drain region, wherein a concentration of the first electrically conductive impurity in the second source region is lower than a concentration of the first electrically conductive impurity in the first source region, wherein a concentration of the first electrically conductive impurity in the second drain region is lower than a concentration of the first electrically conductive impurity in the first drain region, wherein the second source region is thinner than the first source region, wherein the second drain region is thinner than the first drain region, wherein the first source region and the first drain region each contain the first electrically conductive impurity at a concentration equal to 90% or higher of a solid solubility limit at 25° C., wherein at least one of the first source region, the second source region, the first drain region, and the second drain region contains a rare gas element selected from the group consisting of Ar, Kr, and Xe, and wherein a nitride compound of the first electrically conductive impurity is present on each of the second upper surface of the first source region and the third upper surface of the first drain region.

* * * * *